(12) United States Patent
Bernardoni et al.

(10) Patent No.: US 11,018,664 B2
(45) Date of Patent: May 25, 2021

(54) SMART SEMICONDUCTOR SWITCH

(71) Applicant: Infineon Technologies AG, Neubiberg (DE)

(72) Inventors: Mirko Bernardoni, Villach (AT); Christian Djelassi-Tscheck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/924,059

(22) Filed: Jul. 8, 2020

(65) Prior Publication Data

US 2021/0050851 A1 Feb. 18, 2021

(30) Foreign Application Priority Data

Aug. 13, 2019 (DE) .................. 102019121726.1

(51) Int. Cl.
*H03K 3/00* (2006.01)
*H03K 17/16* (2006.01)
(Continued)

(52) U.S. Cl.
CPC .......... *H03K 17/18* (2013.01); *H03K 17/302* (2013.01)

(58) Field of Classification Search
None
See application file for complete search history.

(56) References Cited

U.S. PATENT DOCUMENTS 5,719,509 A * 2/1998 Chan .................... H03K 17/167
326/27
5,862,390 A * 1/1999 Ranjan ............. H03K 19/00361
326/80
(Continued)

FOREIGN PATENT DOCUMENTS

DE 102004063946 A1 3/2006
DE 102016100498 A1 7/2016
(Continued)

OTHER PUBLICATIONS

Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).

(Continued)

*Primary Examiner* — Kenneth B Wells
(74) *Attorney, Agent, or Firm* — Shumaker & Sieffert, P.A.

(57) ABSTRACT

An integrated circuit that may be employed as a smart switch. The integrated circuit includes a first part of a semiconductor switch coupled between a supply node and an output node and configured to provide a first current path in accordance with a first drive signal. The integrated circuit further includes a second part of the semiconductor switch coupled between the supply node and the output node and configured to provide a second current path in accordance with a second drive signal. The integrated circuit includes a drive circuit configured to generate, in response to a switch-on command, the first drive signal and the second drive signal such that the first part of the semiconductor switch and the second part of the semiconductor switch are alter- (Continued)

natingly switched on and off. During an overlap period, both the first and the second part of the semiconductor switch are in an on-state.

15 Claims, 5 Drawing Sheets

(51) Int. Cl.
*H03K 19/00* (2006.01)
*H03K 19/003* (2006.01)
*H03K 17/18* (2006.01)
*H03K 17/30* (2006.01)

(56) References Cited

U.S. PATENT DOCUMENTS

| | | | |
|---|---|---|---|
| 5,877,647 A * | 3/1999 | Vajapey | H03F 1/523 326/27 |
| 6,144,085 A | 11/2000 | Barker | |
| 6,924,669 B2 * | 8/2005 | Itoh | H03K 17/167 326/27 |
| 7,279,765 B2 | 10/2007 | Ahn et al. | |
| 7,489,855 B2 | 2/2009 | Kraus | |
| 8,018,245 B2 * | 9/2011 | Sohn | H03K 19/00361 326/26 |
| 9,413,352 B2 | 8/2016 | Lim | |
| 9,672,201 B1 | 6/2017 | Uszkoreit et al. | |
| 9,887,532 B2 | 2/2018 | Djelassi et al. | |
| 10,305,363 B1 | 5/2019 | Chen et al. | |
| 2002/0024376 A1 | 2/2002 | Sander | |
| 2005/0184715 A1 | 8/2005 | Kidokoro et al. | |
| 2005/0270869 A1 | 12/2005 | Krischke et al. | |
| 2007/0008744 A1 | 1/2007 | Heo et al. | |
| 2012/0194119 A1 | 8/2012 | Kroeze et al. | |
| 2013/0301175 A1 | 11/2013 | Posat | |
| 2014/0078629 A1 | 3/2014 | Cortigiani et al. | |
| 2014/0091384 A1 | 4/2014 | Petruzzi et al. | |
| 2017/0063077 A1 | 3/2017 | Donath et al. | |
| 2017/0294772 A1 | 10/2017 | Illing et al. | |
| 2017/0294918 A1 | 10/2017 | Illing et al. | |
| 2017/0294922 A1 | 10/2017 | Illing et al. | |
| 2017/0366116 A1 | 12/2017 | Ogawa et al. | |
| 2018/0287365 A1 | 10/2018 | Djelassi-Tscheck et al. | |
| 2020/0021207 A1 | 1/2020 | Donat et al. | |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technologies AG, "BTN8962TA High Current PN Half Bridge NovalithIC™," Data Sheet, Rev. 1.0, May 17, 2013, 26 pp.
International Standard ISO 7637-2, Third Edition, Mar. 1, 2011, entitled "Road vehicles—Electrical disturbances from conduction and coupling—Part 2: Electrical transient conduction along supply lines only," 48 pp.
International Standard ISO 26262-1, Second Edition, Dec. 2018, entitled "Road vehicles-Functional safety—Part 1: Vocabulary," 42 pp.
Office Action, in the German language, from counterpart German Application No. DE 10 2019 121 726.1, dated Apr. 28, 2020, 12 pp.

* cited by examiner

SMART SEMICONDUCTOR SWITCH

This application claims priority to German Patent Application Number 102019127726.1, filed Aug. 13, 2019, the entire content of which is incorporated herein by reference.

TECHNICAL FIELD

The present disclosure relates to the field of smart semiconductor switches.

BACKGROUND

In many applications, electrical loads are switched on and off using semiconductor switches. Semiconductor switches that include supplemental circuitry in addition to the electronic switch as such (e.g. a power transistor) are usually referred to as smart electronic switches or simply smart switches. Examples of supplemental circuitry are a temperature sensor for detecting excess temperature, a load current sensor measuring the load current passing through the switch, a control logic that generates a control signal triggering a switch-on or switch-off dependent on an input signal and measured parameters such as the measured current and temperature, and interface circuit for outputting measured parameters, etc.

One example of applications in which smart switches are used is illumination. While some years ago mainly light bulbs were used in illumination applications (e.g. in an automobile), light bulbs are now being increasingly replaced by Light Emitting Diodes (LEDs). LEDs, however, usually need to be supplied with a defined current which can be efficiently carried out using switching converters (e.g. DC/DC converters). LED modules including a plurality of LEDs and a switching converter may have a significant input capacitance, which is not the case for conventional light bulbs. It is understood that many other electronic systems/modules/devices in various fields of applications may exhibit similar input capacitance to LED modules.

However, when using a (smart) semiconductor switch to switch electrical loads that have capacitive characteristics, the inrush currents passing through the semiconductor switch may be comparably high. High inrush currents may lead to high temperatures and result in thermal stress in the semiconductor die. Several concepts exist for protecting semiconductor switches from excess temperature that can damage the device. Nevertheless, there is still room for improvement, particularly when the electric loads to be switched draw comparably high inrush current (e.g. 25 amperes) but only a comparably low nominal current (e.g. 0.3 amperes) during normal operation.

SUMMARY

An integrated circuit that may be employed as a smart switch is described herein. In accordance with one embodiment the integrated circuit includes a first part of a semiconductor switch coupled between a supply node and an output node and configured to provide a first current path between the supply node and the output node in accordance with a first drive signal. The integrated circuit further includes a second part of the semiconductor switch coupled between the supply node and the output node and configured to provide a second current path between the supply node and the output node in accordance with a second drive signal. Furthermore, the integrated circuit includes a drive circuit configured to generate, in response to a switch-on command, the first drive signal and the second drive signal such that the first part of the semiconductor switch and the second part of the semiconductor switch are alternatingly switched on and off, wherein, during an overlap period, both the first and the second part of the semiconductor switch are in an on-state.

Furthermore, a method for switching a load by a semiconductor switch is described herein. In accordance with one embodiment the method includes receiving a switch-on command and generating, in response to receiving the switch-on command, a first drive signal for a first part of the semiconductor switch and the second drive signal for a second part of the semiconductor switch, wherein both parts of the semiconductor switch, when switched on, provide a current path between a supply node and an output node. The first drive signal and the second drive signal are generated such that the first semiconductor switch and the second semiconductor switch are alternatingly switched on and off, wherein, during an overlap period, both the first and the second part of the semiconductor switch are in an on-state.

BRIEF DESCRIPTION OF THE DRAWINGS

The invention can be better understood with reference to the following drawings and descriptions. The components in the figures are not necessarily to scale; instead emphasis is placed on illustrating the principles of the invention. Moreover, in the figures, like reference numerals designate corresponding parts. In the drawings.

DETAILED DESCRIPTION

Figure 1:
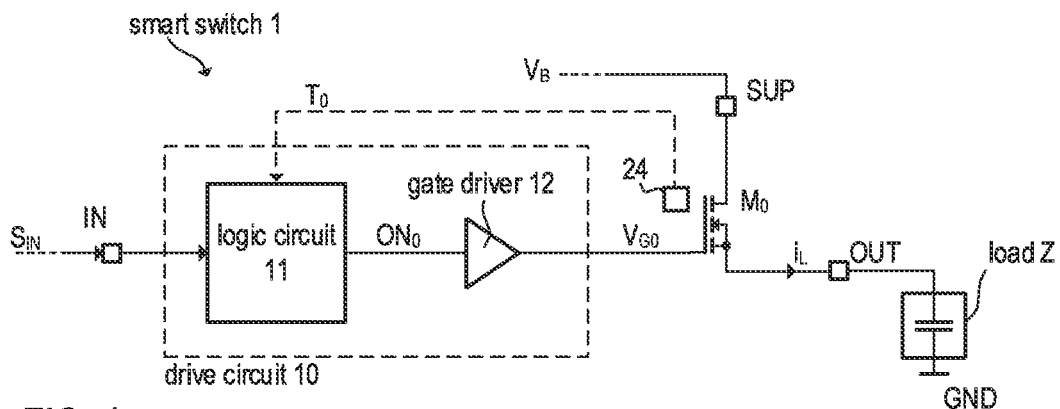
FIG. 1 illustrates a general example of a smart switch.

In the following detailed description, reference is made to the accompanying drawings. The drawings form a part of the description and, for the purpose of illustration, show examples of how the invention may be used and implemented. FIG. 1 illustrates one general example of an integrated smart switch circuit referred to as smart switch 1 in the following. The smart switch 1 may be integrated in a single semiconductor die arranged in a chip package. However, in some embodiments the smart switch 1 may include two or more semiconductor dies arranged in one chip package.

According to FIG. 1 the smart switch 1 includes an electronic switch $M_0$, which may be a power transistor, e.g. a MOS transistor. DMOS transistors may also be used as power transistors. Although the examples discussed herein use MOS transistors as power transistors it is understood that a bipolar transistor may be used instead. A skilled person will have no problem applying the concepts described herein to bipolar transistors. Further, the embodiments described herein relate to high-side switches. It is, however, understood that the concepts described herein can be readily applied to low-side switches. The power transistor $M_0$ is coupled between a supply pin SUP and an output pin OUT of the smart switch 1. Accordingly, the power transistor $M_0$ can connect the output pin OUT to the supply pin SUP when switched on. Similarly, the power transistor $M_0$ can disconnect the output pin OUT from the supply pin SUP when switched off. In other words, the power transistor $M_0$ can enable and disable a load current path between the supply pin SUP and the output pin OUT in accordance with the gate signal VG applied to the transistor's gate electrode. It is understood that, if a bipolar transistor is used as the power transistor, the transistor is switched on and off in accordance with a base current instead of a gate voltage.

In the example of FIG. 1, the gate signal VG is provided by a gate driver circuit 12, which is configured to output the gate signal $V_{G0}$ in accordance with a control signal $ON_0$, which is a binary signal that may only assume a high level (e.g. indicating a switch-on) or a low level (e.g. indicating a switch-off). The control signal $ON_0$ is provided by a logic circuit 11, also referred to as control logic 11. The control logic 11 may include combinational and sequential logic circuits as well as synchronous and asynchronous circuits. The control logic 11 is configured to trigger a switch-on and a switch-off of the transistor $M_0$ (by generating the control signal $ON_0$ with the appropriate logic level) based on the input signal $S_{IN}$, which is received at an input pin IN of the smart switch, and other parameters. The input signal $S_{IN}$ may be generated by an external (separate from the smart switch 1) circuit such as, for example, a microcontroller (not shown in FIG. 1). Control logic 11 and gate driver 12 may be regarded as parts of a drive circuit 10, which is configured to drive the transistor $M_0$ on and off in accordance with the input signal $S_{IN}$ and other parameters, which will be discussed later. In the present example, the input signal $S_{IN}$ is a binary signal that can assume a high level or a low level, wherein a transition from a low level to a high level can be seen as a switch-on command (i.e. a high level indicates to trigger a switch-on of the smart switch), and a transition from a high level to a low level can be seen as a switch-off command (i.e. a low level indicates to trigger a switch-off of the smart switch). It is understood that the meaning of high levels and low levels can be interchanged, which is basically a design choice.

It is noted that the input signal $S_{IN}$ is not necessarily received at an input pin of the smart switch. In some embodiments the smart switch may have a digital communication interface, such as, for example, a Serial Peripheral Interface (SPI) or the like that allows to receive data (e.g. from a microcontroller) including switch-on and switch-off commands. In these embodiments, the smart switch may include circuitry that generates the input signal $S_{IN}$ and sets the logic level of the input signal $S_{IN}$ in accordance with the switch-on and switch-off commands received via the digital communication interface.

The above-mentioned other parameters that may be processed by the drive circuit 10 (e.g. by the control logic 11) for the purpose of generating the control signal $ON_0$ with a specific logic level may be, for example, a measured value representing the chip temperature $T_0$ in the active area of the transistor $M_0$, a measured value representing the load current passing through the transistor $M_0$, configurable threshold values (e.g. an over-temperature threshold), etc. Temperature sensing, e.g. using a pn-junction embedded in or arranged close to the active area of a transistor is well known and thus not further discussed here in detail. The load current $i_L$ that is output at the output pin OUT to a load Z may be measured by a current sense circuit (not shown in FIG. 1). The current sense circuit may, for example, include a sense transistor coupled to power transistor $M_0$ and operated in the same operating point. Current sensing using sense transistors is well known to a skilled person and is thus not discussed in detail herein.

For example, the power transistor may be composed of a plurality of transistor cells of a cell array, wherein one or a few transistor cells of the cell array may be used to form a sense transistor. In a simple embodiment, the current sense circuit may include a current sense resistor connected between a load terminal (e.g. the source terminal) of the transistor $M_0$ and the output pin OUT. In this case the voltage drop across the current sense resistor is indicative of the load current and may be used as current sense signal. A further example of the above-mentioned parameters is a current threshold, which may be used to implement an over-current shut-down function. For example, when the current sense signal provided by the current sense circuit reaches or exceeds a critical current value represented by a threshold value, then the control logic 11 triggers a switch-off of the transistor $M_0$ until a switch-on is again triggered, e.g., by the input signal $S_{IN}$.

In the example of FIG. 1, the smart switch 1 is configured as a high-side switch, i.e. the smart switch 1 is connected between a supply line providing the supply voltage VB (at supply pin SUP) and the load Z, which is connected to the output pin OUT. The smart switch 1 also has a ground pin GND to receive a reference potential $V_{GND}$, which may be defined as zero volts and which serves as a constant reference potential for the circuitry included in the smart switch 1. As mentioned above, the concepts described herein may be readily applied to low-side switches.

Figure 2:
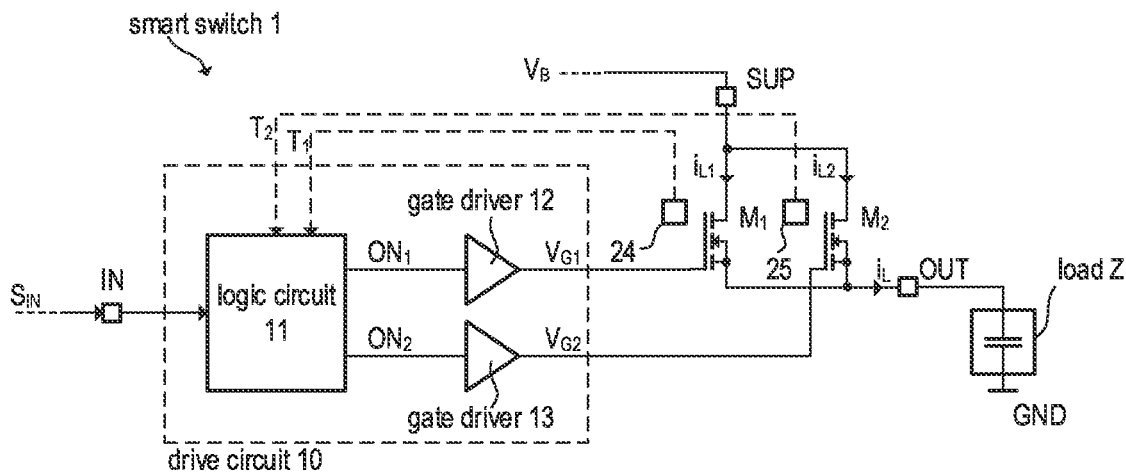
FIG. 2 illustrates one embodiment of a smart switch in which a first part of a semiconductor switch and a second part of the semiconductor switch are alternatingly switched on and off.

FIG. 2 illustrates one embodiment of a smart switch in which a first part of a semiconductor switch and a second part of the semiconductor switch are alternatingly switched on and off. The first and the second part of the semiconductor switch may be regarded as separate transistors having load current paths (e.g. drain-source current paths in case of MOS transistors or collector-emitter current paths in case of (insulated gate) bipolar transistors). Therefore, the first part of the semiconductor switch is represented by transistor $M_1$ and the second part of the semiconductor switch is represented by transistor $M_2$ in the example of FIG. 2. As mentioned, transistors $M_1$ and $M_2$ have common drain electrodes and common source electrodes but separate gate electrodes so they can be switched on and off individually in accordance with the drive signals $V_{G1}$ and, respectively, $V_{G2}$ (gate voltage or current in the case of MOS transistors).

In the depicted example, the gate signals $V_{G1}$ and $V_{G2}$ are generated by gate drivers 12 and, respectively, 13. The gate drivers 12 and 13 are configured to generate the gate signals $V_{G1}$ and $V_{G2}$ in accordance with the control signals $ON_1$ and, respectively $ON_2$, wherein the control signals $ON_1$ and $ON_2$ are binary signals indicating whether the respective transistors $M_1$ and $M_2$ are to be switched on or off. The control signals $ON_1$ and $ON_2$ are generated by the control logic 11 based on the input signal $S_{IN}$ and further parameters such as measured temperature values $T_1$ and $T_2$ that represent the temperatures in the active area of the transistors $M_1$ and $M_2$. The temperature sensor 24 is configured to provide information concerning the temperature $T_1$ of the active area of transistor $M_1$ and the temperature sensor 25 is configured to provide information concerning the temperature $T_2$ of the active area of transistor $M_2$. The temperature sensors 24 and 25 are embedded within or arranged close to the active areas of the respective transistors $M_1$ and, respectively $M_2$. Transistors with integrated temperature sensors are well known in the field of semiconductor technology (see, e.g. U.S. Pat. No. 6,144,085) and thus not further discussed herein.

The mentioned input signal $S_{IN}$ is also a binary signal indicative of whether the load current path between the supply pin SUP and the output pin OUT is to be enabled or disabled. As mentioned above, the input signal $S_{IN}$ is not necessarily a binary signal received at a dedicated input pin IN. Some smart switches include a digital communication interface such as, for example, a Serial Peripheral Interface (SPI) which allows receiving digital switch-on and switch-off commands via a (e.g. serial) data bus. In this case, the input signal $S_{IN}$ may be generated (e.g. by the control logic 11) based on the received switch-on and switch-off commands. In this case, the input signal may be represented by the logic state of a digital register included in the control logic 11.

Figure 3:
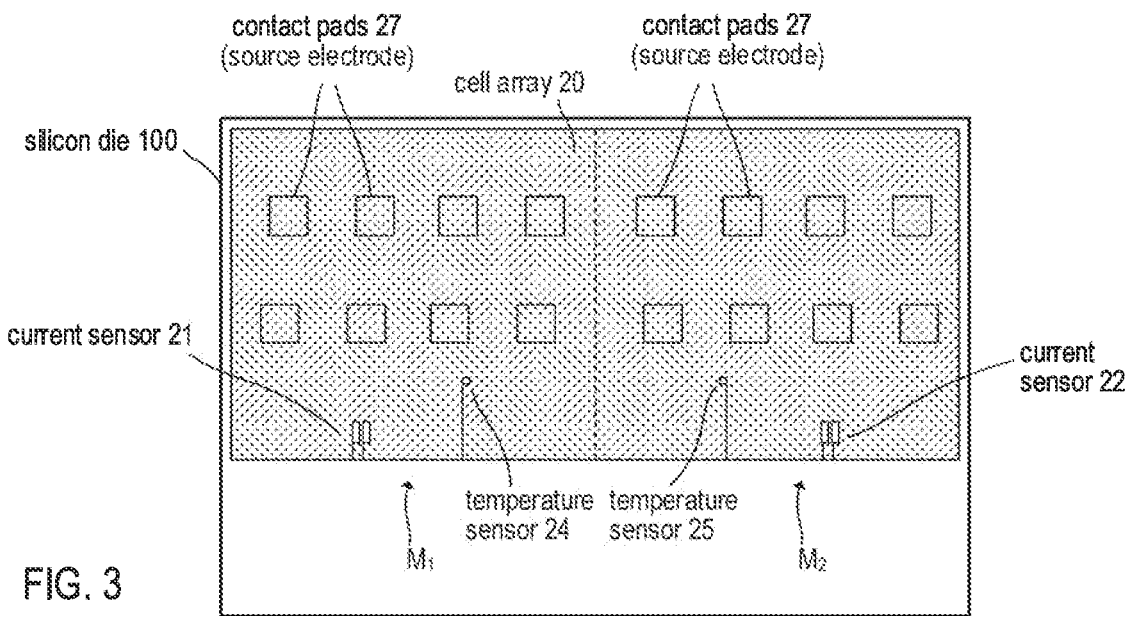
FIG. 3 illustrates an exemplary schematic top view of a semiconductor die illustrating the first and the second part of the semiconductor switch of FIG. 2.

FIG. 3 illustrates an exemplary schematic top view of a semiconductor die 100 illustrating the first and the second part of the semiconductor switch, i.e. the transistors $M_1$ and $M_2$ discussed above. Most of the area of the semiconductor die 100 in which the smart switch 1 is integrated is occupied by the transistors $M_1$ and $M_2$. In the example of FIG. 3, a cell array 20 including a plurality of transistor cells is integrated in the semiconductor die 100, wherein the cell array is divided in two adjacent portions. In the depicted example, the transistor $M_1$ is composed of transistor cells in the left part of the cell array 20 and the transistor $M_2$ is composed of transistor cells in the right part of the cell array 20. Each part (i.e. each one of the transistors $M_1$ and $M_2$) includes a temperature sensor (temperature sensors 24 and 25) and a current sensor (current sensors 21 and 22). As mentioned, the embedding of current sensors and temperature sensors in transistor cell arrays is as such known and not further discussed herein.

As indicated above, the control logic 11 is configured to switch the first and the second transistors $M_1$ and $M_2$ on and off alternatingly, wherein—at least for a short time period (overlap period)—both transistors $M_1$ and $M_2$ are switched on. Switching one transistor off while the other transistor is on helps keep switching losses small. The alternation between the first transistor $M_1$ carrying the load current $i_L$ (which is output at output pin OUT) and the second transistor $M_2$ carrying the load current $i_L$ entails an improved and more uniform distribution of the heat and prevents the formation of local hot spots.

Figure 4:
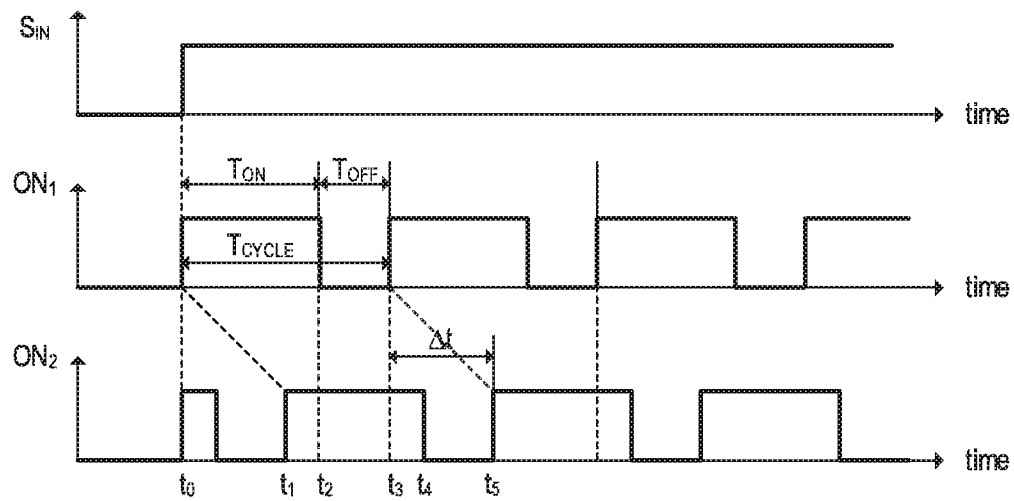
FIG. 4 shows timing diagrams illustrating a first example of a switching scheme for the smart switch of FIG. 2.
Figure 5:
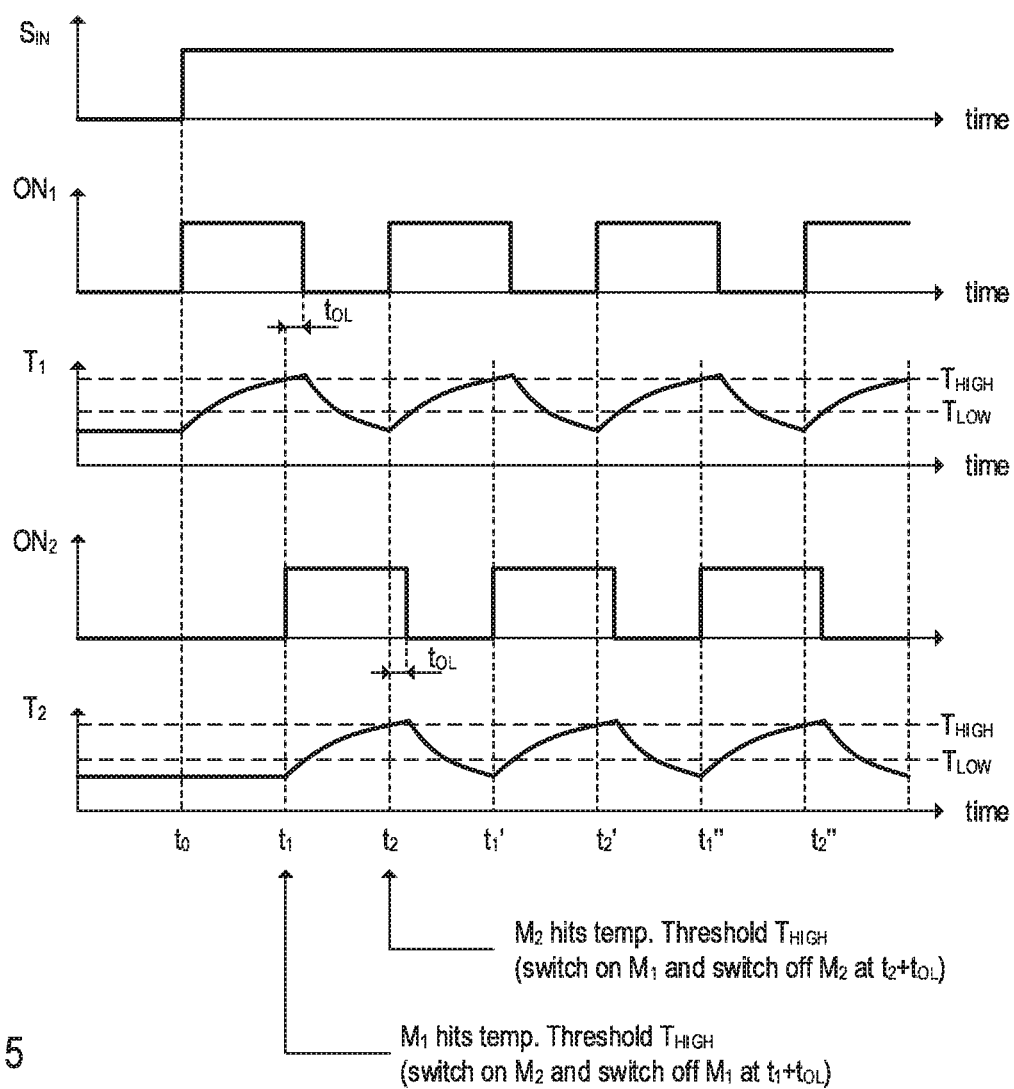
FIG. 5 shows timing diagrams illustrating a second example of a switching scheme for the smart switch of FIG. 2.

The timing diagrams in FIGS. 4 and 5 illustrate two exemplary concepts of how a switching scheme may be implemented in accordance with the embodiments described herein. The first/top timing diagram of FIG. 4 illustrates the input signal $S_{IN}$, which changes from a low level to a high level at time instant $t_0$ indicating that the load current path between the supply pin SUP and the output pin OUT is to be enabled. Enabling the load current path can, in general, be accomplished by switching on the first transistor $M_1$, the second transistor $M_2$, or both transistors, $M_1$ and $M_2$. According to the switching scheme of FIG. 4, the first transistor $M_1$ is switched on at time instant $t_0$ (control signal $ON_1$ changes from a low level to a high level). Subsequently, at time instant $t_1$, the second transistor $M_2$ is switched on (control signal $ON_2$ changes from a low level to a high level). Thereafter, the first transistor $M_1$ is switched off at time instant $t_2$ and is again switched on at time instant $t_3$. Subsequently, the second transistor $M_2$ is switched off at time instant $t_4$ and is again switched on at time instant $t_5$.

As can be seen from FIG. 4, the control signals $ON_1$ and $ON_2$ that trigger the switch-on and switch-off of the transistors $M_1$ and $M_2$, respectively, are pulse-width modulated (PWM) signals having a constant cycle time $T_{CYCLE}$ and a constant duty cycle $T_{ON}/T_{CYCLE}$, wherein the on-time $T_{ON}$ denotes the time period during which a control signal is at a high level and the off-time $T_{ON}$ denotes the time period during which a control signal is at a low level ($T_{CYCLE}=T_{ON}+T_{OFF}$). It can further be seen from FIG. 4 that the PWM signals $ON_1$ and $ON_2$ have a temporal offset $\Delta t$ with respect to each other and a duty cycle greater than 50 percent (e.g. approximately 70 percent). The temporal offset $\Delta t$ is chosen such (e.g. $\Delta t \approx T_{CYCLE}/2$) that the off-time period of control signal $ON_1$ lies within the on-time period of control signal $ON_2$ and vice versa. With such a switching scheme, at least one of the transistors $M_2$ and $M_2$ will be in an on-state as long as the input signal $S_{IN}$ is at a high level. Resetting the level of the input signal $S_{IN}$ to a low level will trigger a switch-off of both transistors $M_1$ and $M_2$ and thus a disconnection of the output pin OUT from the supply pin SUP. With the switching scheme illustrated in FIG. 4 the thermal stress in the semiconductor die 100 can be reduced as compared with a smart switch that operates with a single transistor, such as in the example of FIG. 1 which temporarily switches off the transistor when the measured temperature exceeds a temperature limit.

FIG. 5 illustrates a switching scheme which produces a similar result as the PWM switching scheme illustrated in FIG. 4. However, temperature sense signals $T_1$ and $T_2$, which represent the temperature in the active area of transistors $M_1$ and $M_2$, respectively, are processed to determine the time instants at which the transistors are switched on and off. The first/top diagram of FIG. 5 illustrates the input signal, which changes from a low level to a high level at time instant $t_0$ like in the example of FIG. 4. The scheme starts with a switch-on of transistor $T_1$ at time instant $t_0$ (see second diagram of FIG. 5, a high level of control signal $ON_1$ indicates that the transistor $M_1$ is to be switched on). As a consequence, the temperature $T_1$ of the first transistor $M_1$ starts to rise (see FIG. 5, third diagram) until it reaches an upper threshold value $T_{HIGH}$ at time instant $t_1$. The temperature $T_1$ exceeding the threshold value $T_{HIGH}$ triggers a switch-on of the second transistor $M_2$ at time instant $t_1$ (see FIG. 5, fourth diagram) and a switch-off of the first transistor $M_1$ a delay time $t_{OL}$ later (at time instant $t_1+t_{OL}$). The delay time $t_{OL}$ may be set to a constant value. Starting from time instant $t_1$ the temperature $T_2$ of the second transistor $M_2$ starts to rise (see FIG. 5, fifth diagram) until it reaches an upper threshold value $T_{HIGH}$ at time instant $t_2$. Starting at time instant $t_1+t_{OL}$ the temperature $T_1$ of the first transistor $M_1$ starts to fall and it falls below a further threshold value Low which is slightly lower than the threshold value $T_{HIGH}$. The temperature $T_2$ exceeding the threshold value $T_{HIGH}$ triggers a switch-on of the first transistor $M_1$ at time instant $t_2$ and a switch-off of the second transistor $M_2$ a delay time $t_{OL}$ later (at time instant $t_2+t_{OL}$) and the cycle starts again. As can be seen in FIG. 5, the delay time $t_{OL}$ also determines the overlap period, during which both the first transistor $M_1$ and the second transistor $M_2$ are in an on-state.

It can be seen from FIG. 5 that the temperature-triggered switching leads to a similar result as the PWM modulation of FIG. 4. However, the cycle time is not necessarily constant in the scheme of FIG. 5. It is noted that the switching scheme of FIG. 5 provides an additional safety feature. In situations in which the semiconductor die 100 becomes so hot that the temperature $T_1$ of the first transistor $M_1$ does not fall below the further threshold value Low at time instant $t_2$, then a switch-on of the transistor $M_1$ will be prevented. As a result, at least for a short time, both transistors $M_1$ and $M_2$ will be off and the current path between the supply pin SUP and the output pin OUT will be interrupted until one of the temperature signals $T_1$ or $T_2$ has fallen below the threshold value $T_{LOW}$. If this is the case, the switching scheme can be continued.

Figure 6:
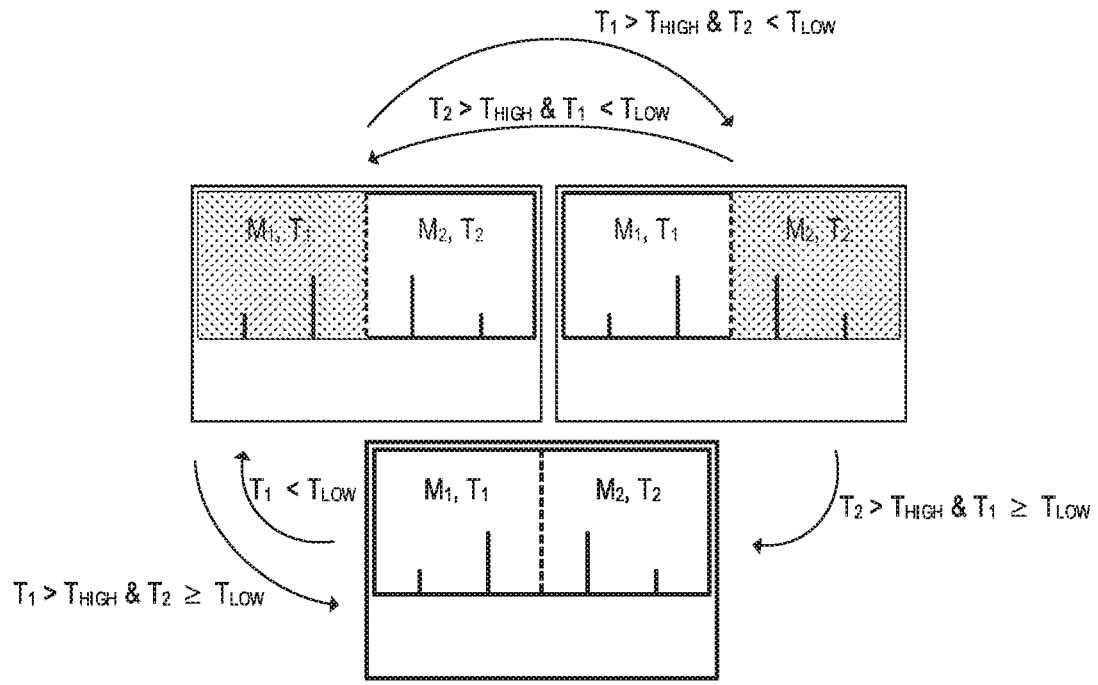
FIG. 6 illustrates a further switching scheme for the smart switch of FIG. 2.

This concept described above is further illustrated in the example of FIG. 6. FIG. 6 illustrates the transistor cell array 20 (see FIG. 3) with the two adjoining transistors $M_1$ and $M_2$ wherein the gray-shading indicates that the respective transistor is switched on. Assuming the switching scheme is started in the situation illustrated at the top left of FIG. 6, the transistor $M_1$ will be on (i.e. temperature $T_1$ increasing) and transistor $M_2$ will be off (i.e. temperature $T_2$ decreasing). When the conditions $T_1 > T_{HIGH}$ and $T_2 < T_{LOW}$ are both fulfilled, the transistor $M_2$ will be switched on (i.e. temperature $T_2$ starts to rise) and, subsequently, transistor $M_1$ will be switched off (i.e. temperature $T_1$ starts to drop). This situation is illustrated at the top right of FIG. 6. When the conditions $T_2 > T_{HIGH}$ and $T_1 < T_{LOW}$ are both fulfilled, then the transistor $M_2$ will be again switched on and transistor $M_1$ will be again switched off. As long as the temperature of the transistor, which is currently off, can fall below the threshold $T_{LOW}$, the smart switch will toggle between the situation illustrated at the top left and the situation illustrated at the top right of FIG. 6.

If however, the temperature $T_1$ of transistor $M_1$ does not fall below the threshold $T_{LOW}$ while switched off (i.e. $T_1 \geq T_{LOW}$), the transistor $M_1$ will not be switched on when temperature $T_2$ of transistor $M_2$ exceeds the threshold $T_{HIGH}$ ($T_2 > T_{HIGH}$), which leads to the situation illustrated at the bottom of FIG. 6 in which both transistors are switched off and can cool. As soon as the temperature $T_1$ of transistor $M_1$ falls below the threshold $T_{LOW}$, it is again switched on, which leads to the situation illustrated at the top left of FIG. 6 and the process continues.

It is noted that the concept described above with reference to FIGS. 5 and 6 can also be implemented with only one temperature threshold, i.e. $T_{LOW} = T_{HIGH}$. In this example, the resulting thermal stress induced in the semiconductor die may be somewhat higher.

Figure 7:
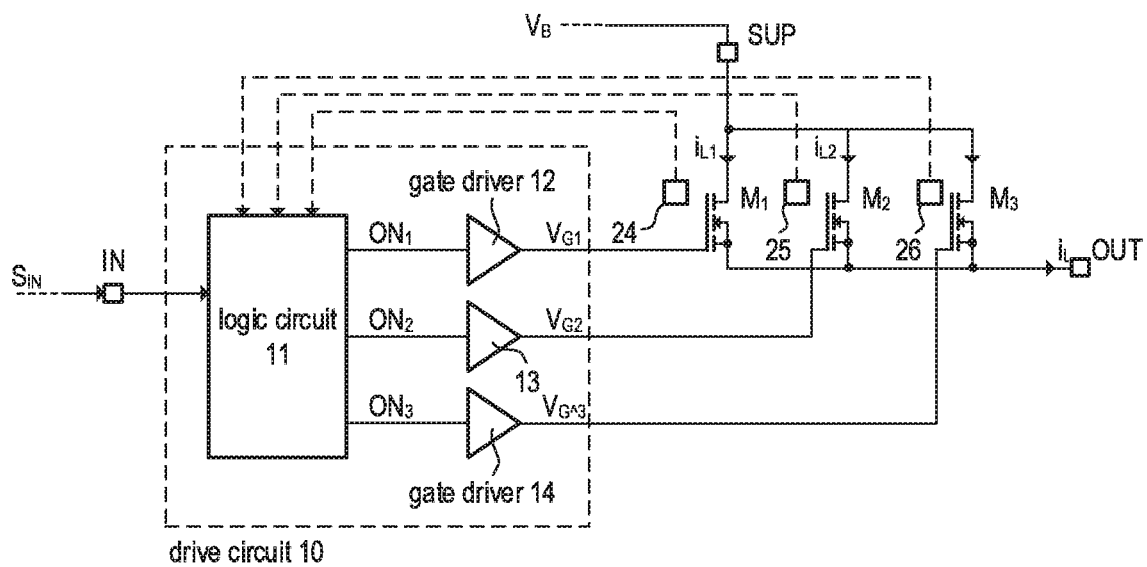
FIG. 7 illustrates another embodiment of a smart switch in which a first part of a semiconductor switch, a second part of the semiconductor switch, and a third part of the semiconductor switch are alternatingly switched on and off.

The embodiments described above use two transistors $M_1$ and $M_2$ whose load current paths are connected in parallel. In other words, the semiconductor switch is divided into two parts, each of which can be individually switched on and off. It is understood that the concept described herein is not limited to two transistors but can also be extended to three or more transistors. FIG. 7 is a circuit diagram illustrating a smart switch similar to the example of FIG. 2 but with three transistors $M_1$, $M_2$, and $M_3$ connected in parallel. In this case, the electronic switch is divided into three parts, each of which can be individually switched on and off. Like in the example of FIG. 2, a temperature sensor is associated with each transistor, wherein temperature sensor 24 measures the temperature of transistor $M_1$, temperature sensor 25 measures the temperature of transistor $M_2$, and temperature sensor 26 measures the temperature of transistor $M_3$. A third gate driver 14 is provided for the third transistor $M_3$, and the remaining elements of FIG. 7 are the same as in FIG. 2 and reference is made to the respective description above to avoid reiterations. The gate drivers 12, 13, and 14 generate the drive signals $V_{G1}$, $V_{G2}$, $V_{G3}$ for the transistors $M_1$, $M_2$, and, respectively, $M_3$ based on the respective control signals $ON_1$, $ON_2$, and $ON_3$.

Figure 8:
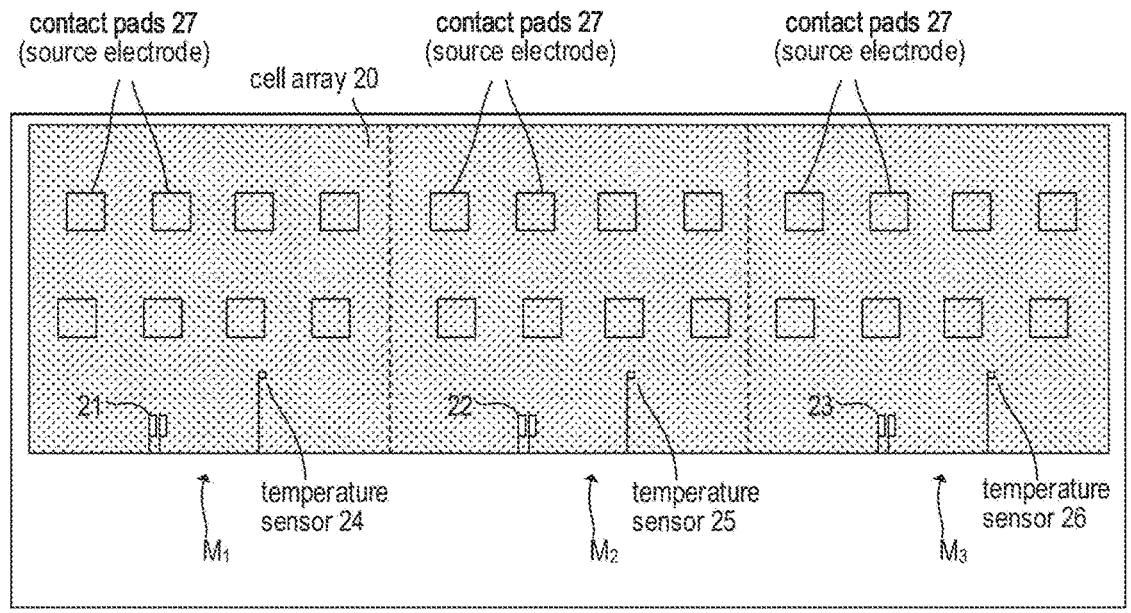
FIG. 8 shows an exemplary schematic top view of a semiconductor die illustrating the first, the second, and the third part of the semiconductor switch of FIG. 7.

FIG. 8 illustrates an exemplary schematic top view of a semiconductor die 100 illustrating the first, the second, and the third part of the semiconductor switch, i.e. the transistors $M_1$, $M_2$, and $M_3$ discussed above. Like in the example of FIG. 3, most of the area of the semiconductor die 100 in which the smart switch 1 is integrated is occupied by the cell array 20 in which the transistors $M_1$, $M_2$, and $M_3$ are formed. Different from FIG. 3, the cell array is divided in three parts corresponding to the three transistors $M_1$, $M_2$, and $M_3$. In the depicted example, the transistor $M_1$ is composed of transistor cells in the left part of the cell array 20, the transistor $M_2$ is composed of the transistor cells in the middle part of the cell array 20, and the transistor $M_3$ is composed of transistor cells in the right part of the cell array 20. Each part (i.e. each one of the transistors $M_1$, $M_2$, and $M_3$) includes a temperature sensor (temperature sensors 24, 25, and 26) and a current sensor (current sensors 21, 22, and 23). As mentioned, the embedding of current sensors and temperature sensors in transistor cell arrays is as such known and not further discussed herein.

Similar as in the previous examples described above, the control logic 11 is configured to switch the first, the second, and the third transistors $M_1$, $M_2$, and $M_3$ on and off alternatingly, wherein—at least for a short time period—at least two of the transistors $M_1$, $M_2$, and $M_3$ are switched on to keep switching losses low. As mentioned, alternatingly carrying the load current with the first, the second and the third transistor $M_1$, $M_2$, and $M_3$, respectively, entails an improved and more uniform distribution of the heat and avoids the formation of local hot spots.

Figure 9:
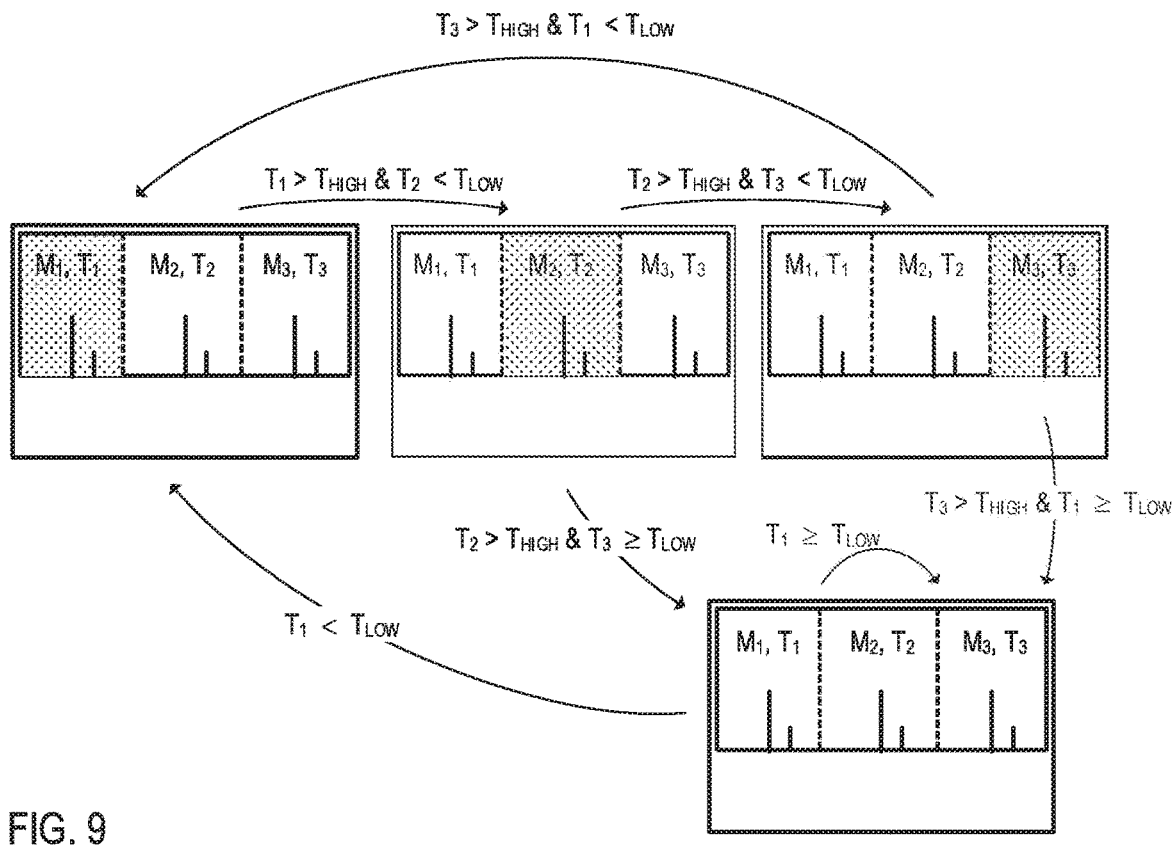
FIG. 9 illustrates a switching scheme for the smart switch of FIG. 7.

FIG. 9 illustrates an exemplary switching scheme for the smart switch of FIGS. 7 and 8. FIG. 9 illustrates the transistor cell array 20 (see FIG. 3) with the three adjoining transistors $M_1$, $M_2$, and $M_3$ wherein the gray-shading indicates that the respective transistor is switched on. Assuming the switching scheme is started in the situation illustrated at the top left of FIG. 9, the transistor $M_1$ will be on (i.e. temperature $T_1$ increasing) and transistors $M_2$ and $M_3$ will be off (i.e. temperature $T_2$ and temperature $T_3$ decreasing). When the conditions $T_1 > T_{HIGH}$ and $T_2 <$ Low are both fulfilled, the transistor $M_2$ will be switched on (i.e. temperature $T_2$ starts to rise) and, subsequently, transistor $M_1$ will be switched off (i.e. temperature $T_1$ starts to drop). This situation is illustrated at the top middle diagram of FIG. 9. When the conditions $T_2 > T_{HIGH}$ and $T_3 < T_{LOW}$ are both fulfilled, the transistor $M_3$ will be switched on (i.e. temperature $T_3$ starts to rise) and transistor $M_2$ will be again switched off (i.e. temperature $T_1$ starts to drop). This situation is illustrated at the top right diagram of FIG. 9. When the conditions $T_3 > T_{HIGH}$ and $T_1 < T_{LOW}$ are both fulfilled, the transistor $M_1$ will be again switched on and, subsequently, transistor $M_3$ will be again switched off. As long as the temperature of the transistors, which are currently off, can fall below the threshold Low, the smart switch will alternate between the situation illustrated in the three top diagrams of FIG. 9.

If, however, the temperature $T_1$ of transistor $M_1$ does not fall below the threshold Low while switched off (i.e. $T_1$ Low), the transistor $M_1$ will not be switched on when temperature $T_3$ of transistor $M_3$ exceeds the threshold $T_{HIGH}$ ($T_3 > T_{HIGH}$), which leads to the situation illustrated at the bottom of FIG. 9 in which all transistors are switched off and can cool. As soon as the temperature $T_1$ of transistor $M_1$ falls below the threshold Low, it is again switched on, which leads to the situation illustrated at the top left diagram of FIG. 9 and the process continues.

Figure 10:
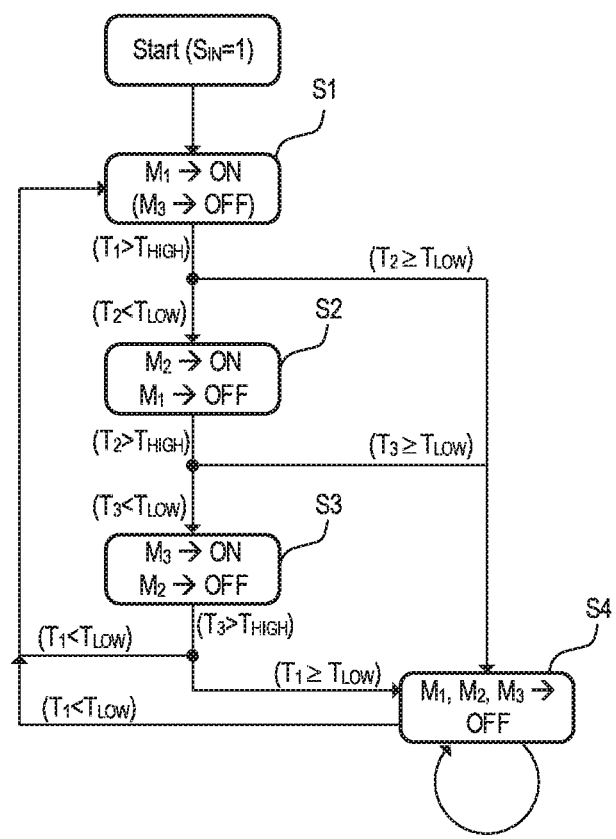
FIG. 10 is a flow chart illustrating a switching scheme for the smart switch of FIG. 7.

The switching scheme of FIG. 9 is further illustrated by the flow chart in FIG. 10. The scheme starts when the input signal $S_{IN}$ indicates to enable the current path between the supply pin SUP and the output pin OUT. In a first step S1, transistor $M_1$ is switched on. As a consequence, the temperature $T_1$ of the first transistor $M_1$ starts to rise. When the temperature $T_1$ exceeds the temperature threshold $T_{HIGH}$, the second transistor $M_2$ will be switched on (FIG. 10, step S2) provided that the temperature $T_2$ of the second transistor $M_2$ is lower than the second threshold Low. Subsequently, the first transistor $M_1$ is switched off to avoid overheating. In the event that the temperature $T_2$ of the second transistor $M_2$ is not lower than the second threshold Low, all transistors will be switched off (FIG. 10, step S4).

When the second transistor $M_2$ has been switched on, the temperature $T_2$ will rise, and when the temperature $T_2$ exceeds the temperature threshold $T_{HIGH}$, the third transistor $M_3$ will be switched on (FIG. 10, step S3) provided that the temperature $T_3$ of the second transistor $M_3$ is lower than the second threshold $T_{LOW}$. Subsequently, the first transistor $M_2$ is switched off to avoid overheating. In the event that the temperature $T_3$ of the third transistor $M_3$ is not lower than the second threshold $T_{LOW}$, all transistors will be switched off (FIG. 10, step S4).

When the third transistor $M_3$ has been switched on, the temperature $T_3$ will rise, and when the temperature $T_3$ exceeds the temperature threshold $T_{HIGH}$, the first transistor $M_1$ will again be switched on (FIG. 10, step S1) provided that the temperature $T_1$ of the first transistor $M_1$ is lower than the second threshold $T_{LOW}$. Subsequently, the third transistor $M_3$ is switched off to avoid overheating. In the event that the temperature $T_1$ of the first transistor $M_1$ is not lower than the second threshold $T_{LOW}$, all transistors will be switched off (FIG. 10, step S4). In the event that all transistors are switched off, the temperature monitoring continues and the first transistor $M_1$ will again be switched on (FIG. 10, step S1) as soon as the respective temperature $T_1$ has dropped below the threshold $T_{LOW}$.

Although the invention has been illustrated and described with respect to one or more implementations, alterations and/or modifications may be made to the illustrated examples without departing from the spirit and scope of the appended claims. For example, the logic levels used to trigger a specific action may be inverted as compared to the depicted examples. Logic gates may be replaced by other logic circuits that perform substantially the same function, etc. In particular regard to the various functions performed by the above described components or structures (units, assemblies, devices, circuits, systems, etc.), the terms used to describe such components are intended to correspond—unless otherwise indicated—to any component or structure that performs the specified function of the described component (e.g., that is functionally equivalent), even though not structurally equivalent to the disclosed structure that performs the function in the herein illustrated exemplary implementations of the invention.

The invention claimed is:

1. An integrated circuit comprising:
a first part of a semiconductor switch coupled between a supply node and an output node and configured to provide a first current path between the supply node and the output node in accordance with a first drive signal;
a second part of the semiconductor switch coupled between the supply node and the output node and configured to provide a second current path between the supply node and the output node in accordance with a second drive signal;
a drive circuit configured to generate, in response to a switch-on command, the first drive signal and the second drive signal such that the first part of the semiconductor switch and the second part of the semiconductor switch are alternatingly switched on and off, wherein, during an overlap period, both the first part and the second part of the semiconductor switch are in an on-state; and
a first temperature sensor configured to sense the temperature of the first part of the semiconductor switch and a second temperature sensor configured to sense the temperature of the second part of the semiconductor switch,
wherein the drive circuit is configured to generate the first drive signal and the second drive signal dependent on the sensed temperatures of the first and second part of the semiconductor switch.

2. The integrated circuit of claim 1,
wherein, in response to the switch-on command, the first drive signal and the second drive signal are periodically switched on for an on-time and off for an off-time.

3. The integrated circuit of claim 2,
wherein the on-time of the first drive signal overlaps with the on-time of the second drive signal, and
wherein the off-time of the first drive signal does not overlap with the off-time of the second drive signal.

4. The integrated circuit of claim 1,
wherein the drive circuit is configured to generate pulse-width modulated signals as the first drive signal and the second drive signal, the pulse-width modulated signals having a cycle time and a duty cycle.

5. The integrated circuit of claim 4,
wherein the duty cycle is greater than 50%.

6. The integrated circuit of claim 5,
the first drive signal is shifted by approximately half the cycle time relative to the second drive signal.

7. The integrated circuit of claim 1,
wherein the drive circuit is configured to generate, in response to a switch-off command, the first drive signal and the second drive signal such that both the first part and the second part of the semiconductor switch are switched off.

8. The integrated circuit of claim 1,
wherein the drive circuit is configured to trigger a switch-off of the semiconductor switch in response to a detected over-temperature or a switch-off command.

9. The integrated circuit of claim 1,
wherein the drive circuit is configured to generate the first drive signal and the second drive signal such that while the first part of the semiconductor switch is on, the second part of the semiconductor switch is switched on in response to the temperature of the first part reaching or exceeding a first temperature threshold provided that the temperature of the second part is below a second temperature threshold, and subsequently the first part of the semiconductor switch is switched off.

10. The integrated circuit of claim 9,
wherein the drive circuit is configured to generate the first drive signal and the second drive signal such that while the first part of the semiconductor switch is on, the first part of the semiconductor switch is switched off in response to the temperature of the first part reaching or exceeding the first temperature threshold without switching on the second part of the semiconductor switch when the temperature of the second part is not below the second temperature threshold.

11. The integrated circuit of claim 1,
wherein the semiconductor switch is integrated in a semiconductor body that includes a cell array comprising a plurality of transistor cells, wherein a first portion of the transistor cells form the first part of the semiconductor switch and a second portion of the transistor cells form the second part of the semiconductor switch.

12. A method comprising:
receiving a switch-on command;
generating, in response to receiving the switch-on command, a first drive signal for a first part of a semiconductor switch and a second drive signal for a second part of the semiconductor switch,
wherein both parts of the semiconductor switch, when switched on, provide a current path between a supply node and an output node, and
wherein the first drive signal and the second drive signal are generated such that the first part of the semiconductor switch and the second part of the semiconductor switch are alternatingly switched on and off, wherein, during an overlap period, both the first part and the second part of the semiconductor switch are in an on-state; and
sensing a temperature of the first part of the semiconductor switch via a first temperature sensor and sensing a temperature of the second part of the semiconductor switch via a second temperature sensor,
wherein generating the first drive signal and the second drive signal is dependent on the sensed temperatures of the first part and second part of the semiconductor switch.

13. The method of claim 12,
wherein the switch-on command is represented by a transition from a low-level to a high level, or vice versa, in an input signal.

14. A method comprising:
receiving a switch-on command;
generating, in response to receiving the switch-on command, a first drive signal for a first part of a semiconductor switch and a second drive signal for a second part of a semiconductor switch; and
sensing a first temperature of the first part of the semiconductor switch and a second temperature of the second part of the semiconductor switch,
wherein both parts of the semiconductor switch, when switched on, provide a current path between a supply node and an output node, and
wherein, in response to a switch-on command, the first drive signal and the second drive signal are generated in accordance with a switching scheme, that includes, in response to the first temperature of the first part of the semiconductor switch reaching a first threshold:
switching on the second part of the semiconductor switch provided that the second temperature of the second part is below a second threshold, and
switching off the first part of the semiconductor switch.

15. The method of claim 14,
wherein the switching scheme further includes, in response to the second temperature of the second part of the semiconductor switch reaching the first threshold:
switching on the first part or a third part of the semiconductor switch provided that the first temperature of the first part or a third temperature of the third part is below the second threshold, and
switching off the second part of the semiconductor switch.

* * * * *